Nov. 7, 1961 A. UHLIR, JR 3,008,089

SEMICONDUCTIVE DEVICE COMPRISING P-I-N CONDUCTIVITY LAYERS

Filed Feb. 20, 1958

INVENTOR
A. UHLIR, JR.

BY Arthur J. Torsiglieri
ATTORNEY

United States Patent Office 3,008,089

Patented Nov. 7, 1961

3,008,089

SEMICONDUCTIVE DEVICE COMPRISING P-I-N CONDUCTIVITY LAYERS

Arthur Uhlir, Jr., Mountainside, N.J., assignor to Bell Telephone Laboratories, Incorporated, New York, N.Y., a corporation of New York Filed Feb. 20, 1958, Ser. No. 716,328
7 Claims. (Cl. 330—5)

Figure 1:
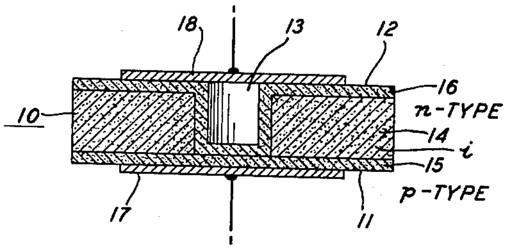

This invention relates to semiconductive diode structures.

It is well known that the frequency response of a semiconductive junction diode is limited by the capacitance associated with the p-n junction in the semiconductive element of the diode. As a consequence, in a diode to be operated at high frequencies it is important to provide a semiconductive element with a p-n junction of small area. It is also advantageous that this limited area junction be provided in a semiconductive element which is rugged and easy to handle and to which sturdy electrical connections can readily be made.

In one important aspect, the present invention is directed at a semiconductive diode in which these desiderata are realized to a high degree.

A feature of the invention is a semiconductive diode in which the semiconductive element is of novel geometry and structure. In particular, the semiconductive element has two major surfaces oppositely disposed of which one advantageously is planar and the other is dimpled over at least one fractional portion to provide at such portion a limited region where the two major surfaces are much closer together than their average separation. Moreover, each of the major surfaces is characterized by a zone which is of high conductivity type, of opposite type for the respective zones, and the bulk portion of the element intermediate between such surface zones is of substantially intrinsic conductivity. It is found in such a structure that the electrical characteristics are almost completely determined by the characteristics of the dimpled region of the element. Accordingly, by making this dimpled region of limited area, the high frequency advantages of a small area diode are realized. However, the remainder of the element provides the bulk necessary to facilitate handling. In particular, the large area surface zones simplify the problem of providing low resistance electrical connections to opposite sides of the p-n junction. Additionally, the enclosure of the active dimpled region within a large inactive volume provides added protection against the influence of undesirable surface ambients. Various other advantages are discussed below.

If the two major surface zones come together at the region of the dimple, the element has the properties of a limited area p-n structure. If an intrinsic layer of significant thickness remains intermediate between the two surface zones at the region of the dimple, the element has the properties of a limited area p-i-n structure.

Embodiments of the invention have special application to parametric amplifiers of the kind known to workers in the art in which a junction diode is used as a nonlinear capacitance to amplify signal power. In particular, a semiconductive element of the kind described which has been prepared to include a plurality of dimpled p-n regions arranged along its length may be used to provide a multistage amplifier of this kind. In a structure of this kind, the thick regions intermediate between the successive dimpled regions may be used as a low-loss wave guiding medium for coupling successive amplifier stages. By appropriately shaping the high conductivity surface layers of such intermediate regions, desired propagating characteristics can be achieved for the signal path and the pumping power path. In this way, there is avoided the complications ordinarily arising when a plurality of discrete diodes are inserted along a conventional transmission line to provide a succession of parametric amplifier stages.

Figure 2:
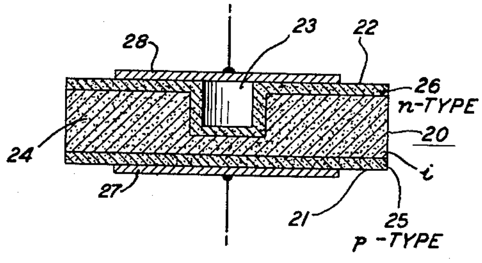
Figure 3:
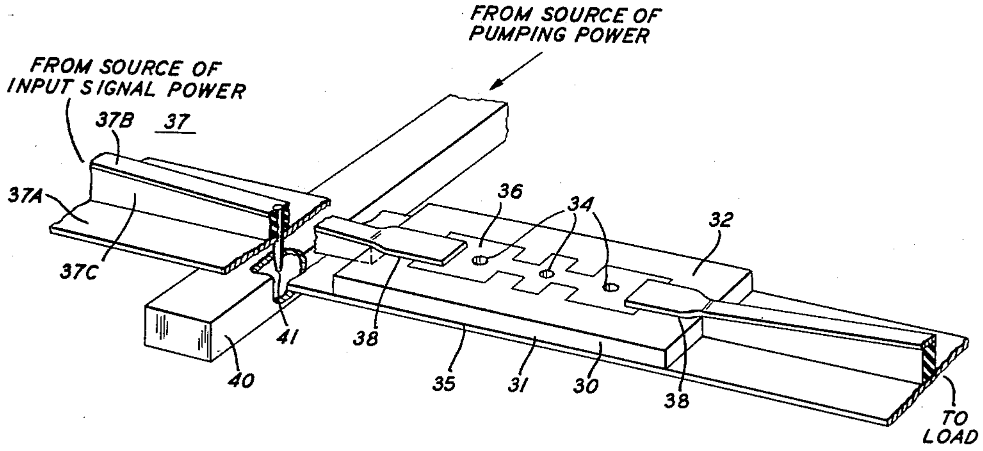

The invention will be better understood from the following more detailed description, taken in conjunction with the accompanying drawings, in which:

FIG. 1 shows in section as one illustrative embodiment of the invention a small area p-n structure included within a larger semiconductive element;

FIG. 2 shows in section as another illustrative embodiment of the invention a small area p-i-n structure incorporated within a larger semiconductive element; and FIG. 3 shows in perspective as another illustrative embodiment of the invention an arrangement in which a succession of p-n diodes are incorporated within a semiconductive element which serves as a wave guiding medium for coupling together successive diodes.

With reference now to the drawing, FIG. 1 shows a wafer 10 of crystalline semiconductor, such as germanium or silicon, having a pair of opposed major surfaces 11, 12. Surface 11 is substantially planar over its entire area. Surface 12, although substantially planar over most of its area, is characterized by a central fractional portion which is indented or dimpled whereby its separation from the opposite major surface 11 is considerably less than the separation therefrom of the substantially planar portion of the surface. The indentation or dimple 13 typically is circular in cross section.

The bulk portion 14 of the semiconductive material is of a substantially intrinsic conductivity. Since it is not feasible to achieve perfectly intrinsic material, this means that the bulk of the wafer need be only of high resistivity material, either of p- or n-type conductivity. The major surface 11 has over most or all of its surface a layer 15 which is low resistivity p-type. The major surface 12 conversely has over most or all of its surface, including the dimpled region 13, a layer 16 which is low resistivity n-type. It is feasible to reverse the conductivity types of the surface layers 15 and 16. The thicknesses of layers 15 and 16 are chosen so that at the indentation 13 they substantially meet, thereby forming at this region a p-n junction. Throughout the remainder of the element, the separation between layers 15 and 16 is substantial relative to the width of the depletion layer associated with the p-n junction. For example, in a structure in which the depletion layer associated with the p-n junction is $10^{-5}$ centimeters, a typical intrinsic region thickness is $10^{-2}$ centimeters. Low resistance electrode connections 17, 18 are provided to layers 15 and 16, respectively. Advantageously, the electrode 18 covers the dimple 13 completely.

The device described when viewed between electrode connections 17 and 18 has properties which are almost completely determined by the p-n junction formed at the dimple 13. As such by making the area of this junction small, there is realized a diode which is useful at high frequencies.

Additionally, the mechanical strength and ease of handling of the device described is determined by the size of the semiconductive wafer. A large size improves the heat dissipation characteristics of the device. Moreover, there is made available the large surfaces associated with layers 15, 16 for providing large area connections which facilitates the problem of making low resistance connections.

Moreover, the protection against ambients afforded by enveloping the small active region in the large inactive bulk and covering the dimple by the electrode make it feasible even to avoid the need for encapsulation in some applications or, at least, to relax the requirements of such encapsulation.

As still other advantages, the overload properties of the device in the forward direction will be improved since in case of overload the large area p-i-n junction will tend to conduct current and thereby to protect the small area p-n junction, while the breakdown properties of the device in the reverse direction are enhanced because the geometry provided minimizes the risk of surface breakdown.

A device of this kind is useful in many applications. By providing a graded p-n junction, a factor which makes the capacitance of the junction particularly sensitive to any applied reverse voltage, the device described is well adapted for use in parametric amplifiers in which a p-n junction is used as the nonlinear reactive element. The theory of amplifiers of this kind is described in an article in the RCA Review, entitled "Theory of Parametric Amplifiers," volume 18, pages 578 through 593 (1957).

FIG. 2 shows a modified form of dimpled diode designed to provide a p-i-n junction of limited area in a larger enveloping mass. The semiconductive wafer 20 similarly includes a planar major surface 21 and an indented major surface 22 characterized by the centered dimple 23. The bulk 24 of the wafer is substantially intrinsic, and the opposite major surfaces include high resistivity layers 25, 26 of opposite conductivity type. In this structure, an intrinsic layer of thickness approximately a diffusion length of the charge carriers therein is provided at the dimple 23 between opposed surface layers 25, 26. Ordinarily, the thickness of the intrinsic layer should be sufficiently thin that the charge carriers can be injected therein and extracted therefrom in a time which is short compared to the desired switching interval. Low resistance connections 27, 28 are made to layers 25, 26, respectively. The result is a p-i-n diode whose properties are fixed primarily by the properties of the dimpled region 23. Such a p-i-n diode has a variety of applications. Typically, such a diode may be used as a high frequency limiter or as a high frequency switch. In the latter application, a D.C. voltage source is used to bias the p-i-n junction in the forward direction when the closed position is desired and in the reverse direction when the open position is desired.

Various techniques are available for fabricating devices of the kind described. It is generally convenient to form in a single slice of a semiconductor a plurality of semiconductive elements and thereafter to dice the slice appropriately.

A typical process which may be used is described below. A monocrystalline slice of substantially intrinsic silicon, i.e., of specific resistivity in excess of 500 ohm-centimeters is prepared of dimensions approximately an inch square and ten mils thick. Thereafter, circular holes approximately five mils in diameter and five mils thick are drilled in a two dimensional array on one of the major faces spaced apart approximately fifty mils. Such holes may readily be made by an appropriately shaped ultrasonic cutting tool in the manner known to workers in the art. High conductivity layers are thereafter provided on opposite major faces by the diffusion therein of appropriate conductivity-type determining impurities, in the manner known to workers in the art. Typically, boron is diffused into one major surface to form a heavily doped p-type layer and phosphorus diffused into the other major surface to form a heavily doped n-type layer. A representative process of this kind is described in United States Patent 2,804,405, which issued August 27, 1957, to L. Derick and C. J. Frosch. Basically, this process involves forming by vapor-solid diffusion boron and phosphorus-rich shallow surface layers on opposite faces of the silicon wafer and thereafter heating to diffuse the boron and phosphorus deeper into the interior of the wafer. The diffusion process is controlled either to have the two diffused layers be separated from one another at the dimpled portions to provide p-i-n junctions there or to have the two diffused layers meet at the dimpled portions to provide p-n junctions there. Moreover, when it is desired to have graded p-n junctions it is sometimes advantageous to continue the diffusion until the diffused regions overlap at the dimpled regions. This technique makes it possible to achieve a low series resistance. A low series resistance is especially advantageous in diodes to be used as nonlinear capacitive elements in parametric amplifiers.

The silicon wafer can then be sawed into a plurality of elements each of which includes a dimpled p-n junction. Individual low resistance connections are then provided to opposite surface layers of the individual elements in conventional manner.

It should be evident that various other techniques are feasible for the fabrication of elements of the kind described involving various combinations of drilling, masking, diffusing and lapping steps. With silicon particularly, use can be made of the fact that a silicon oxide film may be used advantageously as a mask in vapor-solid diffusion processes.

FIG. 3 shows a multistage parametric amplifier. It comprises an elongated semiconductive element 30 which includes a succession of variable capacitance dimpled p-n junctions of the kind shown in FIG. 1. In this regard, the semiconductive crystal has a pair of opposed major surfaces 31, 32 of which lower surface 31 is a planar and upper surface 32 includes a succession of regularly spaced indentation for forming an aligned array of dimples 34. As in the device shown in FIG. 1, the bulk of the crystal is intrinsic but the major surfaces are characterized by high conductivity layers 35, 36, respectively, of opposite conductivity type. The layers 35 and 36 meet to form small area p-n junctions at each of the dimples 34 in the manner described for the device shown in FIG. 1. In this instance, the pair of high conductivity surface layers 35 and 36 serve as the two conductors and the intermediate intrinsic material as the dielectric interspace of a two-conductor transmission line which includes periodically along its length lumped variable capacitances in the form of the dimpled p-n junctions. The propagating characteristics of this line can readily be tailored to provide a desired electrical length between successive p-n junctions by appropriate choice of the pattern of at least one of the high conductivity surface layers. Various of the patterns used in the microstrip line art are feasible. In the arrangement depicted, the pattern of the high conductivity surface layer 36 is that of an inductively loaded line. Various other patterns are feasible, for example, a serpentine shape. The high conductivity surface layer 36, on the other hand, covers all of its surface.

A p-i-n transmission line of the kind described typically will have a characteristic impedance lower than that of conventional transmission lines; and, accordingly, it is generally advantageous to provide impedance transformers where the p-i-n transmission line is coupled to a conventional transmission line.

In the arrangement shown, separate sections of a microstrip line 37 comprising two parallel plate conductors 37A, 37B separated by a dielectric 37C is used to supply input signal power to and abstract output signal power from the respective ends of the p-i-n transmission line. Impedance transformers 38 are provided intermediate the sections of the microstrip line and the p-i-n. A microstrip line impedance transformed typically comprises a short section of microstrip line which is characterized by a gradual taper in either the width of one or both of the two constituent conductors or their separation. As shown, the transformers 38 include a decrease in separation of the two conductors 37A, 37B and a change in width of the conductor 37B.

The pumping power is also applied to the microstrip line for transmission to the p-i-n line. To this end pumping which is supplied to the wave guide 40 for transmission from the pumping source is transferred to the microstrip line by a technique known to workers in the art involving the probe 41 which extends from the strip conductor 37B through the ground plate 37A into the wave guide 40 for transferring pumping power therefrom to the microstrip line. Typically, the pumping frequency may be about twice the signal frequency. Known techniques are available to provide transmission of the pumping power selectively in the direction of the p-i-n line. Known techniques are available to separate the pumping power from the signal power at the output.

The propagating characteristics of the p-i-n line and the electrical separation along the p-i-n line of successive amplifier stages is adjusted to maintain phase relations optimum for amplification at the successive amplifier stages.

It will be obvious that a large number of amplifier stages may be provided along a single p-i-n line. Moreover, the electrical separation of the successive amplifiers along the line and the propagating characteristics of the successive sections may vary to provide desired effects, such as broadening of effective bandwidth or unidirectional amplifying characteristics.

Various modifications of the arrangement described will be apparent to a worker in the art without departing from the spirit and scope of the invention. For example, in addition to the non-planar configuration described above, the p-i-n transmission line advantageously includes two planar surfaces. The p-i-n line may be used for transmission between successive amplifier stages of only the signal power, separate means being used for the transmission of the pumping power. Conversely, the p-i-n line may be used for transmission of pumping power and other means for transmission of the signal power. Additionally, various other forms of transmission lines are feasible for supplying the signal and pumping powers to the p-i-n line.

In the light of the foregoing, it is obvious that the arrangements described are merely illustrative of the general principles of the invention.

What is claimed is:

1. Semiconductive apparatus comprising a waveguiding medium consisting of a semiconductive wafer having a pair of opposed major faces of which one is planar and the other includes at least one indentation for forming a dimpled region of reduced separation between said major faces, the bulk of the wafer being substantially intrinsic, and each of the major faces including a continuous layer of high conductivity, the conductivity types of the opposed layers being opposite and the high conductivity layers being contiguous at the dimpled region for forming there a p-n junction enclosed by an n-i-p region.

2. Semiconductive apparatus comprising a semiconductive wafer having a pair of opposed major faces of which one is planar and the other includes a plurality of indentations for forming a succession of dimpled regions of reduced separation between said major faces, the bulk of the wafer being substantially intrinsic and each of the major faces including a separate continuous layer of high conductivity, the conductivity types of the opposed layers being opposite, and the high conductivity layers being contiguous at the dimpled regions for forming a succession of p-n junctions spaced by p-i-n regions, a two-conductor transmission line, the separate conductors of which make low resistance connections to one set of ends of the high conductivity layers for applying signal power for transmission along the wave guiding medium, a two-conductor transmission line, separate conductors of which make low resistance connection to the other set of ends of the high conductivity layers for extracting signal power from the wave guiding medium, and means for applying pumping power of a frequency different than that of the signal power to the wave guiding medium for varying the capacitance of the succession of p-n junctions.

3. A semiconductive device comprising a semiconductive wafer having a bulk which is substantially intrinsic and on opposite faces thereof opposed continuous layers of high conductivity and of opposite conductivity type for defining a wave guiding path along said wafer, and separate means at each end of the wave guiding path for connecting respectively the two opposing layers of opposite conductivity type.

4. In combination, a semiconductive device forming a parallel pair transmission line comprising a semiconductor wafer including opposing extended continuous extrinsic surface layers of opposite conductivity type spaced apart by a thicker substantially intrinsic region, means at one end of the wafer interconnected between the two surface layers for launching wave energy along said wafer, and means at the opposite end of the wafer interconnected between the two surface layers for abstracting the wave energy launched at the first-mentioned end.

5. A semiconductor device comprising a semiconductive wafer having a pair of opposed major faces of which one is planar and the other includes at least one indentation for forming there a dimpled region of reduced separation between said major faces, the bulk of the wafer being substantially intrinsic and each of the major faces including a continuous layer of high conductivity, the conductivity types of said continuous layers being opposite, said continuous layers being contiguous at each dimpled region for forming a p-n junction enclosed by a p-i-n region, and separate low resistance connections to the high conductivity layers.

6. A semiconductor device comprising a semiconductive wafer having a pair of opposed major faces of which one is planar and the other includes at least one indentation for forming there a dimpled region of reduced separation between said major faces, the bulk of the wafer being substantially intrinsic and each of the major faces including a continuous layer of high conductivity, the conductivity types of said continuous layers being opposite for forming of said reduced separation a p-i-n junction, and separate low resistance connections to the high conductivity layers.

7. A semiconductor device comprising a semiconductive wafer having a pair of opposed major faces of which one is planar and the other includes a succession of dimpled regions of reduced separation between said major faces, the bulk of the wafer being substantially intrinsic and each of the major faces including a continuous layer of high conductivity, the conductivity types of said continuous layers being opposite, said continuous layers being contiguous at each dimpled region for forming a p-n junction enclosed by a p-i-n region, and separate low resistance connections to the high conductivity layers.

References Cited in the file of this patent

UNITED STATES PATENTS

| | | |
|---|---|---|
| 2,689,930 | Hall | Sept. 21, 1954 |
| 2,760,013 | Peter | Aug. 21, 1956 |
| 2,770,761 | Pfann | Nov. 13, 1956 |
| 2,790,940 | Prince | Apr. 30, 1957 |
| 2,816,228 | Johnson | Dec. 10, 1957 |
| 2,820,154 | Kurshan | Jan. 14, 1958 |
| 2,840,497 | Longini | June 24, 1958 |
| 2,887,627 | Haas et al. | May 19, 1959 |